(12) United States Patent
Horn et al.

(10) Patent No.: US 9,831,632 B2
(45) Date of Patent: Nov. 28, 2017

(54) LASER COMPONENT AND METHOD OF PRODUCING IT

(71) Applicants: OSRAM Opto Semiconductors GmbH, Regensburg (DE); OSRAM GmbH, München (DE)

(72) Inventors: Markus Horn, Regensburg (DE); Andreas Breidenassel, Bad Abbach (DE); Karsten Auen, Regensburg (DE); Bernhard Stojetz, Wiesent (DE); Thomas Schwarz, Regensburg (DE)

(73) Assignees: OSRAM Opto Semiconductor GmbH (DE); OSRAM GmbH (DE)

( * ) Notice: Subject to any disclaimer, the term of this patent is extended or adjusted under 35 U.S.C. 154(b) by 209 days.

(21) Appl. No.: 14/533,292

(22) Filed: Nov. 5, 2014

(65) Prior Publication Data

US 2015/0055667 A1 Feb. 26, 2015

Related U.S. Application Data

(63) Continuation-in-part of application No. PCT/EP2014/058609, filed on Apr. 28, 2014.

(30) Foreign Application Priority Data

May 13, 2013 (DE) .................. 10 2013 208 670
Nov. 28, 2013 (DE) .................. 10 2013 224 420

(51) Int. Cl.
*H01S 5/022* (2006.01)
*H01S 5/024* (2006.01)
*H01S 5/40* (2006.01)

(52) U.S. Cl.
CPC ...... *H01S 5/02208* (2013.01); *H01S 5/02236* (2013.01); *H01S 5/02272* (2013.01);
(Continued)

(58) Field of Classification Search
CPC ............. H01S 5/02208; H01S 5/02272; H01S 5/4025; H01S 5/02236; H01S 5/405;
(Continued)

(56) References Cited

U.S. PATENT DOCUMENTS

| | | |
|---|---|---|
| 3,878,556 A | 4/1975 | Nyul |
| 4,901,325 A | 2/1990 | Kato et al. |

(Continued)

FOREIGN PATENT DOCUMENTS

| | | |
|---|---|---|
| DE | 100 36 283 A1 | 2/2002 |
| DE | 102 29 712 A1 | 1/2004 |

(Continued)

OTHER PUBLICATIONS

German Search Report dated Oct. 22, 2013 corresponding to German Application No. 10 2013 208 670.9.
(Continued)

*Primary Examiner* — Xinning Niu
(74) *Attorney, Agent, or Firm* — DLA Piper LLP (US)

(57) ABSTRACT

A laser component includes a housing in which a first carrier block is arranged. A first laser chip having an emission direction is arranged on a longitudinal side of the first carrier block. The first laser chip electrically conductively connects to a first contact region arranged on the first carrier block and a second contact region arranged on the first carrier block. There is a respective electrically conductive connection between the first contact region and a first contact pin of the housing and between the second contact region and a second contact pin of the housing.

27 Claims, 10 Drawing Sheets

(52) U.S. Cl.
CPC ...... *H01S 5/02276* (2013.01); *H01S 5/02469* (2013.01); *H01S 5/405* (2013.01); *H01S 5/4018* (2013.01); *H01S 5/4025* (2013.01); *H01S 5/4031* (2013.01); *H01L 2924/19107* (2013.01); *H01S 5/02216* (2013.01); *H01S 5/02248* (2013.01); *H01S 5/02296* (2013.01); *H01S 5/02476* (2013.01)

(58) Field of Classification Search
CPC .. H01S 5/4031; H01S 5/4018; H01S 5/02276; H01S 5/02469; H01S 5/02476; H01S 5/02248; H01S 5/02216; H01S 5/02296; H01L 2924/19107
See application file for complete search history.

(56) References Cited

U.S. PATENT DOCUMENTS

| | | | |
|---|---|---|---|
| 5,835,515 A * | 11/1998 | Huang | G02B 6/4249 372/36 |
| 2003/0052960 A1 | 3/2003 | Okazaki | |
| 2004/0240800 A1* | 12/2004 | Uchida | G02B 6/4201 385/92 |
| 2006/0034571 A1 | 2/2006 | Nagano et al. | |
| 2008/0025361 A1 | 1/2008 | Jerman et al. | |
| 2008/0234560 A1 | 9/2008 | Nomoto et al. | |
| 2009/0040477 A1 | 2/2009 | Matsumoto | |
| 2010/0006863 A1 | 1/2010 | Ban et al. | |
| 2012/0177074 A1 | 7/2012 | Liu et al. | |
| 2012/0275174 A1 | 11/2012 | Takahashi et al. | |
| 2013/0272329 A1* | 10/2013 | Auen | H01S 5/024 372/34 |

FOREIGN PATENT DOCUMENTS

| | | |
|---|---|---|
| EP | 0 971 304 A2 | 1/2000 |
| EP | 2 518 838 A2 | 10/2012 |
| JP | 2002-109774 A | 4/2002 |
| JP | 2003-243760 | 8/2003 |
| JP | 2006-54366 | 2/2006 |
| JP | 2007-019301 A | 1/2007 |
| JP | 2007-311680 A | 11/2007 |
| JP | 2009-44066 | 2/2009 |
| JP | 2009-105284 A | 5/2009 |
| JP | 2009-129934 A | 6/2009 |
| JP | 2013-054386 | 3/2013 |

OTHER PUBLICATIONS

German Search Report dated Dec. 10, 2013 corresponding to German Application No. 10 2013 224 420.7.
International Search report dated Jun. 18, 2014 corresponding to PCT/EP2014/058609.

* cited by examiner

LASER COMPONENT AND METHOD OF PRODUCING IT

TECHNICAL FIELD

This disclosure relates to laser components and methods of producing laser components.

BACKGROUND

When producing laser components, it is known to arrange laser chips in housings, wherein exactly one chip is arranged in each housing. To achieve a higher optical power, it is necessary to combine a plurality of such housings, as a result of which an assembly outlay increases. In that case, the achievable power density is limited by the housing size. The power density achievable is not sufficient for some technical applications, for instance, projection applications. It is known to further increase the obtainable optical power density by using compression optical units. In that case, however, the complexity, costs and spatial dimensions of the overall system increase further.

SUMMARY

We provide a laser component including a housing, the housing including a base surface and side walls perpendicular to the base surface, wherein a first contact pin and a third contact pin are arranged in a first side wall, a second contact pin and a fourth contact pin are arranged in a second side wall being opposed to the first side wall, a first carrier block and a second carrier block are arranged parallel to each other at the base surface, a first laser chip is arranged on a longitudinal side of the first carrier block and a further laser chip is arranged on a longitudinal side of the second carrier block, an emission direction of the first laser chip and of the further laser chip is oriented perpendicular to the base surface, the first carrier block and the second carrier block each comprise a first contact region and a second contact region arranged on longitudinal sides of the carrier blocks, each first contact region and each second contact region comprises a first face and a second face, the first face and the second face electrically conductively connected to one another and oriented perpendicular to each other, the first laser chip electrically conductively connects to the first faces of the first contact region and of the second contact region of the first carrier block, the further laser chip electrically conductively connects to the first faces of the first contact region and of the second contact region of the second carrier block, the second face of the first contact region of the first carrier block electrically conductively connects to the first contact pin, the second face of the second contact region of the first carrier block electrically conductively connects to the second contact pin, the second face of the first contact region of the second carrier block electrically conductively connects to the third contact pin, and the second face of the second contact region of the second carrier block electrically conductively connects to the fourth contact pin.

We also provide a method of producing a laser component including arranging a first laser chip having an emission direction on a longitudinal side of a first carrier block; arranging a further laser chip having an emission direction on a longitudinal side of a second carrier block; establishing an electrically conductive connection between a first face of a first contact region arranged on the longitudinal side of the first carrier block, the first laser chip and a first face of a second contact region arranged on the longitudinal side of the first carrier block; establishing an electrically conductive connection between a first face of a first contact region arranged on the longitudinal side of the second carrier block, the further laser chip and a first face of a second contact region arranged on the longitudinal side of the second carrier block; arranging the first carrier block and the second carrier block parallel to each other on a base surface of a housing such that the emission direction of the first laser chip and of the further laser chip is oriented perpendicular to the base surface; establishing an electrically conductive connection between a second face of the first contact region of the first carrier block and a first contact pin arranged in a first side wall of the housing, the first side wall being arranged perpendicular to the base surface; establishing an electrically conductive connection between a second face of the second contact region of the first carrier block and a second contact pin arranged in a second side wall of the housing, the second side wall being arranged perpendicular to the base surface and being opposed to the first side wall; establishing an electrically conductive connection between a second face of the first contact region of the second carrier block and a third contact pin arranged in the first side wall of the housing; and establishing an electrically conductive connection between a second face of the second contact region of the second carrier block and a fourth contact pin arranged in the second side wall of the housing, the first face and the second face of each first contact region and each second contact region respectively electrically conductively connected to one another and oriented perpendicular to each other.

LIST OF REFERENCE SIGNS

Figure 1:
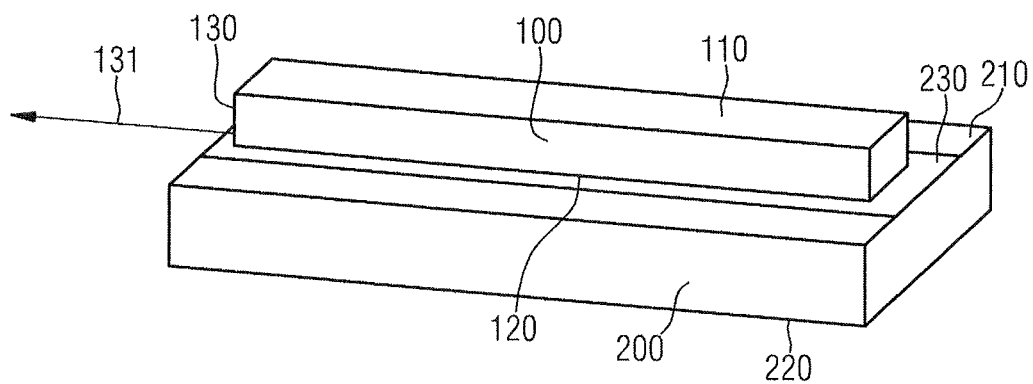
FIG. 1 shows a laser chip arranged on a heat sink.

100 Laser chip
101 First laser chip
102 Second laser chip
103 Third laser chip
104 Fourth laser chip
105 Fifth laser chip
106 Sixth laser chip
110 Top side
120 Underside
130 End side 131 Emission direction
200 Heat sink
201 First heat sink
202 Second heat sink
203 Third heat sink
204 Fourth heat sink
205 Fifth heat sink
206 Sixth heat sink
210 Top side
220 Underside
230 Metallization
300 Carrier block
301 First carrier block
302 Second carrier block
303 Third carrier block
304 Fourth carrier block
310 First contact block
311 First face
312 Second face
320 Second contact block
321 First face
322 Second face
330 Longitudinal side
331 Longitudinal direction
340 Base side
350 Series circuit
351 First conductive connection
352 Second conductive connection
353 Third conductive connection
354 Fourth conductive connection
355 Fifth conductive connection
356 Sixth conductive connection
357 Seventh conductive connection
358 Eighth conductive connection
359 Ninth conductive connection
400 Housing
401 First contact pin
402 Second contact pin
403 Third contact pin
404 Fourth contact pin
405 Fifth contact pin
406 Sixth contact pin
407 Seventh contact pin
408 Eighth contact pin
410 Interior
411 Base surface
420 Bushing
430 Glass window
500 Laser component
1300 Carrier block
1301 First carrier block
1302 Second carrier block
1310 First pin
1311 First face
1312 Second face
1313 Outer longitudinal end
1314 Inner longitudinal end
1320 Second pin
1321 First face
1322 Second face
1330 Insulator
1340 Opening
1500 Laser component
2300 Carrier block
2310 Pin
2311 First face
2312 Second face
2313 Outer longitudinal end
2314 Inner longitudinal end
2315 Flattened portion
2330 Insulator
2340 Opening
3300 Carrier block
3310 Pin
3311 First face
3312 Second face
3313 Outer longitudinal end
3314 Inner longitudinal end
3330 Insulator
3340 Opening
4300 Carrier block
4310 Pin
4311 First face
4312 Second face
4313 Outer longitudinal end
4314 Inner longitudinal end
4330 Insulator
4340 Opening
4341 Shoulder
5300 Carrier block
5310 Pin
5311 First face
5312 Second face
5313 Outer longitudinal end
5314 Inner longitudinal end
5330 Insulator
5340 Opening
5341 Shoulder
5350 Sleeve
5360 Solder

DETAILED DESCRIPTION

Our laser component comprises a housing. The housing comprises a base surface and side walls perpendicular to the base surface. A first contact pin and a third contact pin are arranged in a first side wall. A second contact pin and a fourth contact pin are arranged in a second side wall opposed to the first side wall. A first carrier block and a second carrier block are arranged parallel to each other at the base surface. A first laser chip is arranged on a longitudinal side of the first carrier block and a further laser chip is arranged on a longitudinal side of the second carrier block. An emission direction of the first laser chip and the further laser chip is oriented perpendicular to the base surface. The first carrier block and the second carrier block each comprise a first contact region and a second contact region arranged on the longitudinal sides of the carrier blocks. Each first contact region and each second contact region comprises a first face and a second face, the first face and the second face electrically conductively connected to one another and oriented perpendicular to each other. The first laser chip electrically conductively connects to the first faces of the first contact region and of the second contact region of the first carrier block. The further laser chip electrically conductively connects to the first faces of the first contact region and of the second contact region of the second carrier block. The second face of the first contact region of the first carrier block electrically conductively connects to the first contact pin. The second face of the second contact region of the first carrier block electrically conductively connects to the second contact pin. The second face of the first contact region of the second carrier block electrically conductively connects to the third contact pin. The second face of the second contact region of the second carrier block electrically conductively connects to the fourth contact pin.

Our method of producing a laser component comprises arranging a first laser chip having an emission direction on a longitudinal side of a first carrier block, arranging a further laser chip having an emission direction on a longitudinal side of a second carrier block, establishing an electrically conductive connection between a first face of a first contact region arranged on the longitudinal side of the first carrier block, the first laser chip and a first face of a second contact region arranged on the longitudinal side of the first carrier block, establishing an electrically conductive connection between a first face of a first contact region arranged on the longitudinal side of the second carrier block, the further laser chip and a first face of a second contact region arranged on the longitudinal side of the second carrier block, arranging the first carrier block and the second carrier block parallel to each other on a base surface of a housing such that the emission direction of the first laser chip and of the further laser chip is oriented perpendicular to the base surface, and establishing an electrically conductive connection between a second face of the first contact region of the first carrier block and a first contact pin arranged in a first side wall of the housing. The first side wall is arranged perpendicular to the base surface.

The method further comprises establishing an electrically conductive connection between a second face of the second contact region of the first carrier block and a second contact pin arranged in a second side wall of the housing. The second side wall is arranged perpendicular to the base surface and opposed to the first side wall. The method further comprises establishing an electrically conductive connection between a second face of the first contact region of the second carrier block and a third contact pin arranged in the first side wall of the housing, and establishing an electrically conductive connection between a second face of the second contact region of the second carrier block and a fourth contact pin arranged in the second side wall of the housing. The first face and the second face of each first contact region and each second contact region respectively electrically conductively connect to one another and are oriented perpendicular to each other.

The above-described properties, features and advantages and the way in which they are achieved will become clearer and more clearly understood in association with the following description of the examples that are explained in greater detail in association with the drawings.

FIG. 1 shows a perspective and slightly schematic illustration of a laser chip 100 arranged on a heat sink 200. The heat sink 200 can also be designated as a submount.

The laser chip 100 is a semiconductor chip with an integrated laser diode. The laser chip 100 can be based on an InGaN material system, for example. The laser chip 100 has the shape of an elongated cuboid having a top side 110, an underside 120 opposite the top side 110, and an end side 130. An electrical contact of the laser chip 100 is arranged at the top side 110 and the underside 120 of the laser chip 100. Electrical voltage can be applied to the laser chip 100 via the electrical contacts. The laser chip 100 emits a laser beam in an emission direction 131 at its end side 130 when electrical voltage is applied. The emission direction 131 is oriented perpendicular to the end side 130 of the laser chip 100.

In the example illustrated, the heat sink 200 has the shape of a thin lamina. The heat sink 200 can be a ceramic lamina, for example. The heat sink 200 comprises an electrically insulating material having the best possible thermal conductivity. By way of example, the heat sink 200 can comprise AlN, SiC or diamond. The heat sink 200 has a top side 210 and an underside 220 opposite the top side 210. A metallization 230 is arranged on the top side 210 of the heat sink 200, the metallization covering part of the top side 210 or the entire top side 210 of the heat sink 200.

The laser chip 100 is arranged on the metallization 230 on the top side 210 of the heat sink 200. In this case, the underside 120 of the laser chip 100 faces the top side 210 of the heat sink 200 and is in thermal and electrically conductive contact with the metallization 230. As a result, the electrical contact on the underside 120 of the laser chip 100 electrically conductively connects to the metallization 230 of the heat sink 200. The underside 120 of the laser chip 100 is preferably soldered onto the metallization 230 on the top side 210 of the heat sink 200. By way of example, the laser chip 100 can be soldered onto the heat sink 200 using an AuSn solder at a temperature of approximately 280° C.

The laser chip 100 arranged on the heat sink 200 can be subjected to a functional test in the processing state illustrated in FIG. 1. By way of example, the laser chip 100 arranged on the heat sink 200 can be tested in pulsed operation.

Figure 2:
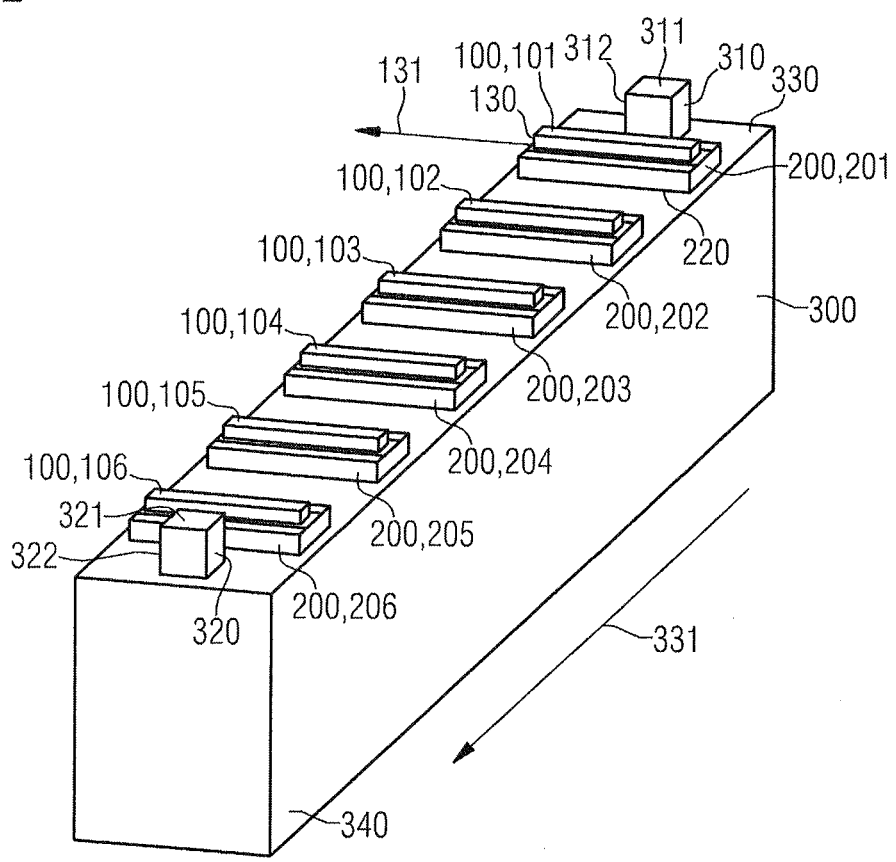
FIG. 2 shows a carrier block with a plurality of heat sinks with laser chips arranged thereon.

FIG. 2 shows a perspective and slightly schematic illustration of a carrier block 300. The carrier block 300 has the shape of an elongated cuboid having a longitudinal side 330 oriented parallel to a longitudinal direction 331 of the carrier block 300. A base side 340 of the carrier block 300 is arranged perpendicular to the longitudinal side 330 of the carrier block 300, the base side likewise being oriented parallel to the longitudinal direction 331. The carrier block 300 can have dimensions of 1 mm×1 mm×10 mm, for example. In this case, the carrier block 300 can preferably have the longest length in the longitudinal direction 331. The carrier block 300 comprises a material having a high thermal conductivity. The thermal conductivity of the carrier block 300 may, for example, be higher than 300 W/mK. By way of example, the carrier block 300 can comprise copper. It is also possible for the carrier block 300 to have a different shape than a cuboidal shape.

A first heat sink 201, a second heat sink 202, a third heat sink 203, a fourth heat sink 204, a fifth heat sink 205 and a sixth heat sink 206 are arranged on the longitudinal side 330 of the carrier block 300. Each of the heat sinks 201, 202, 203, 204, 205, 206 is like the heat sink 200 in FIG. 1. A first laser chip 101 is arranged on the first heat sink 201. A second laser chip 102 is arranged on the second heat sink 202. A third laser chip 103 is arranged on the third heat sink 203. A fourth laser chip 104 is arranged on the fourth heat sink 204. A fifth laser chip 105 is arranged on the fifth heat sink 205. A sixth laser chip 106 is arranged on the sixth heat sink 206. Each of the laser chips 101, 102, 103, 104, 105, 106 is like the laser chip 100 in FIG. 1. Hereinafter, the heat sinks 201, 202, 203, 204, 205, 206 and laser chips 101, 102, 103, 104, 105, 106 are designated collectively as heat sinks 200 and laser chips 100.

The heat sinks 200 are in good thermal contact with the carrier block 300. Preferably, the heat sinks 200 are soldered onto the longitudinal side 330 of the carrier block 300. By way of example, the heat sinks 200 can be soldered onto the carrier block 300 using an SnAgCu solder at a temperature of approximately 230° C.

The heat sinks 200 are arranged on the longitudinal side 330 of the carrier block 300 alongside one another such that the emission directions 131 of all the laser chips 100 are oriented parallel to one another. In this case, the emission directions 131 of the laser chips 100 are oriented parallel to the longitudinal side 330 and perpendicular to the longitudinal direction 331 of the carrier block 300.

Two heat sinks 200 adjacent to one another are at a distance from one another that is dimensioned such that mutual thermal influencing of the respective laser chips 100 arranged on the heat sinks 200 is as small as possible. At the same time, an arrangement of the laser chips 100 that saves as much space as possible is preferred. By way of example, two heat sinks 200 arranged alongside one another can be at a distance of 1 mm to 5 mm from one another. Two neighboring heat sinks 200 and thus also two neighboring laser chips 100 may, for example, comprise a distance of 4 mm from one another.

Six heat sinks 200 with laser chips 100 are arranged on the longitudinal side 330 of the carrier block 300. It is possible to provide fewer or more than six heat sinks 200 with laser chips 100 on the longitudinal side 330 of the carrier block 300.

In addition to the heat sinks 200 with the laser chips 100, a first contact block 310 and a second contact block 320 are arranged on the longitudinal side 330 of the carrier block 300. The first contact block 310 is arranged at a first longitudinal end of the longitudinal side 330 in the longitudinal direction 331. The second contact block 320 is arranged at a second longitudinal end of the longitudinal side 330 in the longitudinal direction 331. The heat sinks 200 are arranged between the first contact block 310 and the second contact block 320.

The first contact block 310 and second contact block 320 each have a cuboidal shape. The first contact block 310 has a first face 311 and a second face 312. The first face 311 is oriented parallel to the longitudinal side 330 of the carrier block 300. Correspondingly, the second contact block 320 also has a first face 321 oriented parallel to the longitudinal side 330 of the carrier block 300. The second face 312 of the first contact block 310 is oriented parallel to the base side 340 of the carrier block 300. In this case, the base side 340 of the carrier block 300 and the second face 312 of the first contact block 310 face in opposite spatial directions. The second contact block 320 has a second face 322 oriented like the second face 312 of the first contact block 310.

The first contact block 310 and the second contact block 320 are electrically insulated from the carrier block 300. By way of example, the first contact block 310 and the second contact block 320 can comprise an electrically insulating material, for instance a ceramic material such as AlN. The first face 311 and the second face 312 of the first contact block 310 are coated with an electrically conductive material, for example, a metal and electrically conductively connect to one another. Correspondingly, the first face 321 and the second face 322 of the second contact block 220 also have electrically conductive coatings connected to one another. The first contact block 310 and the second contact block 320 can be soldered, for example, on the longitudinal side 330 of the carrier block 300.

Figure 3:
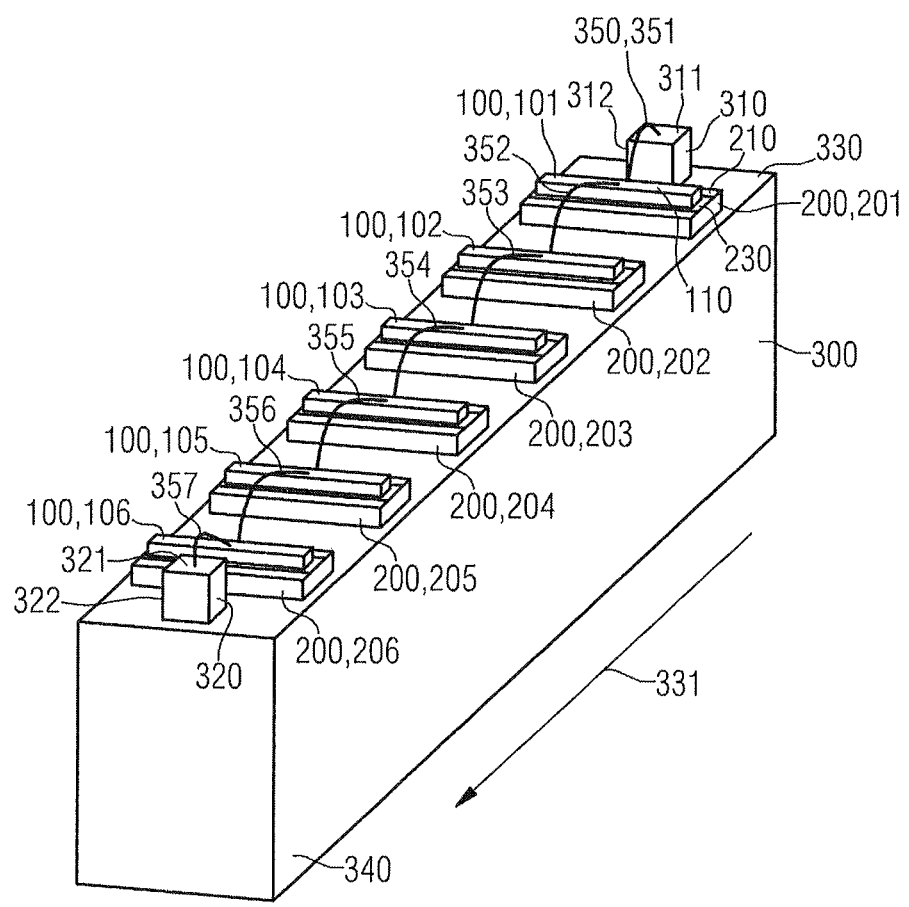
FIG. 3 shows the carrier block with laser chips electrically connected in series.

FIG. 3 shows a schematic perspective illustration of the carrier block 300 in a processing state temporally succeeding the illustration in FIG. 2. In the processing state in FIG. 3, the laser chips 100 on the longitudinal side 330 of the carrier block 300 and the first contact block 310 and the second contact block 320 are arranged in an electrical series circuit 350 by virtue of electrically conductive connections. A first conductive connection 351 extends from the first face 311 of the first contact block 310 to the metallization 230 on the top side 210 of the first heat sink 201. A second conductive connection 352 extends between the top side 110 of the first laser chip 101 and the metallization 230 of the second heat sink 202. A third conductive connection 353 extends from the top side 110 of the second laser chip 120 to the metallization 230 on the top side 210 of the third heat sink 203. A fourth conductive connection 354 extends from the top side 110 of the third laser chip 103 to the metallization 230 of the fourth heat sink 204. A fifth conductive connection 355 extends from the top side 110 of the fourth laser chip 104 to the metallization 230 of the fifth heat sink 205. A sixth conductive connection 356 extends from the top side 110 of the fifth laser chip 105 to the metallization 230 of the sixth heat sink 206. A seventh conductive connection 357 extends from the top side 110 of the sixth laser chip 106 to the first face 321 of the second contact block 320. The conductive connections 351, 352, 353, 354, 355, 356, 357 can be, for example, wire bonding connections or ribbon bonding connections.

In the processing state illustrated in FIG. 3, the laser chips 100 arranged on the longitudinal side 330 of the carrier block 300 can be subjected to a further functional test. By way of example, the laser chips 103 in the processing state shown in FIG. 3 can be subjected to a functional test in continuous-wave operation.

It is also possible to dispense with the heat sinks 200. The undersides of the laser chips 100 are then arranged directly on the longitudinal side 330 of the carrier block 300. In this case, an electrically insulating layer can be arranged on the longitudinal side 330 of the carrier block 300.

Alternatively, the electrical contacts on the undersides 120 of the laser chips 100 arranged directly on the longitudinal side 330 of the carrier block 300 can be electrically short-circuited by the carrier block. In this case, it is possible to arrange the laser chips 100 between the first contact block 310 and the second contact block 320 in a parallel circuit.

Figure 4:
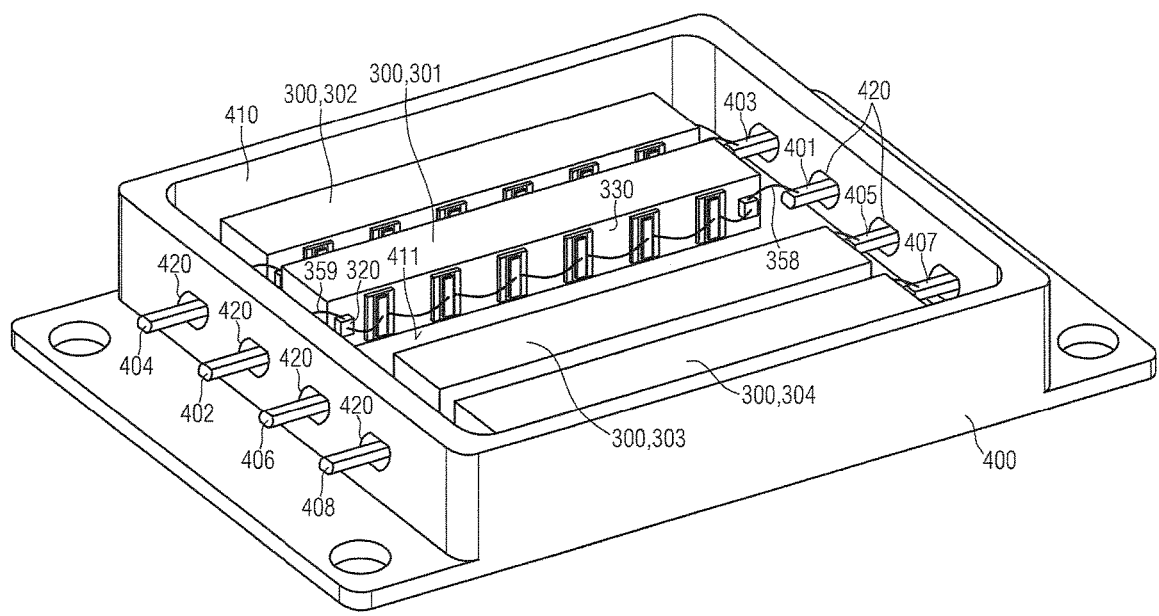
FIG. 4 shows a housing of a laser component with a plurality of carrier blocks arranged thereon.
Figure 5:
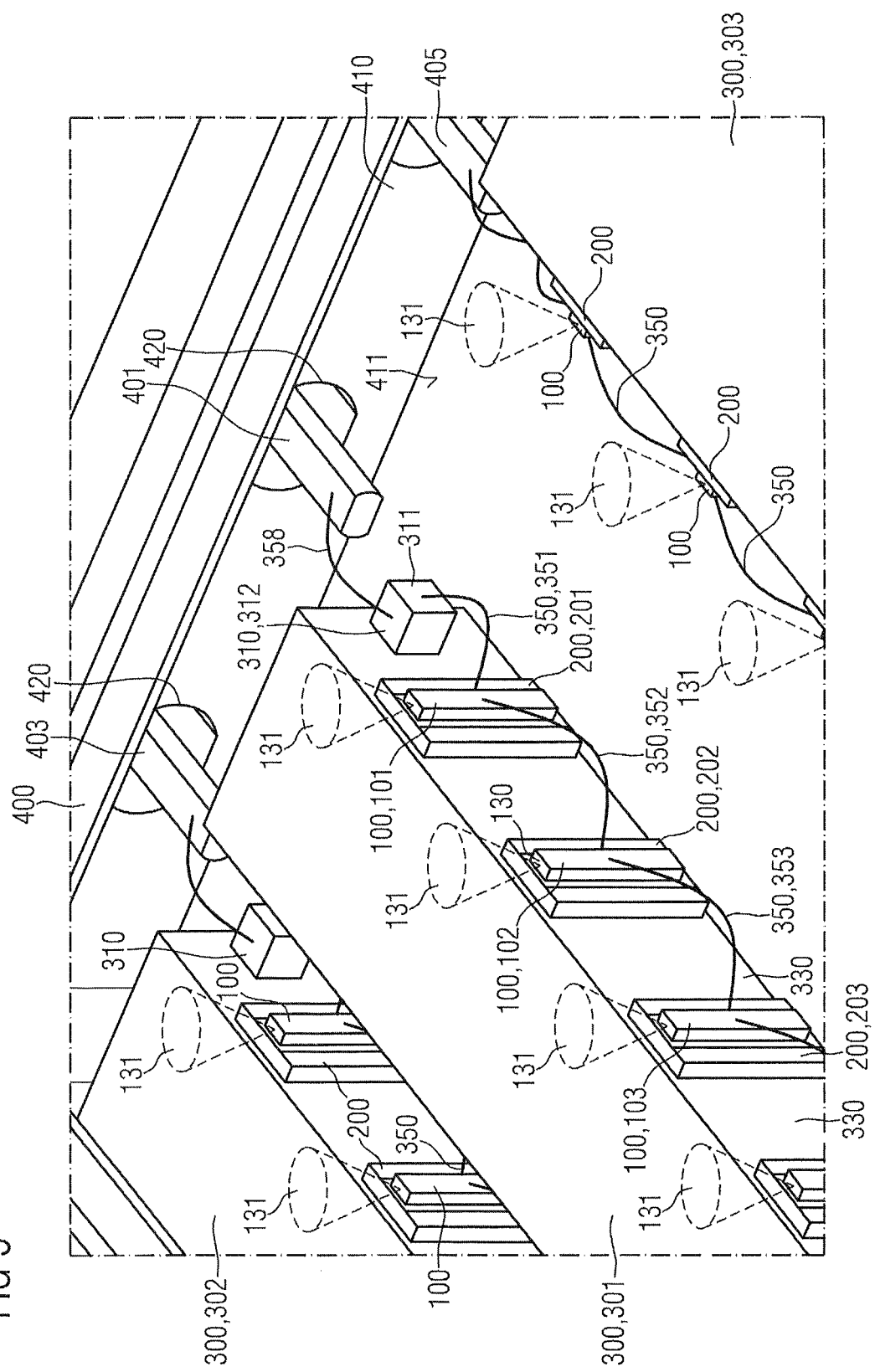
FIG. 5 shows a detailed view of the housing with the carrier blocks arranged therein.

FIG. 4 shows a schematic perspective illustration of a housing 400. The housing 400 is open such that an interior 410 of the housing 400 with a base surface 411 of the housing 400 is visible and accessible. Side walls of the housing 400 are perpendicular to the base surface 411. FIG. 5 shows an enlarged illustration of part of the housing 400.

By way of example, the base surface 411 of the housing 400 can comprise copper. The side walls of the housing 400 can comprise the same material as the base surface 411 or another material.

The housing 400 has a first contact pin 401, a second contact pin 402, a third contact pin 403, a fourth contact pin 404, a fifth contact pin 405, a sixth contact pin 406, a seventh contact pin 407 and an eighth contact pin 408. The contact pins 401, 402, 403, 404, 405, 406, 407, 408 each comprise an electrically conductive material and lead from the outer side of the housing 400 through bushings 420 arranged in the side walls of the housing 400 into the interior 410 of the housing 400. The bushings 420 are preferably arranged in a sealing fashion and can be glass bushings, for example. The first contact pin 401, the third contact pin 403, the fifth contact pin 405 and the seventh contact pin 407 are arranged in a first side wall of the housing 400. The second contact pin 402, the fourth contact pin 404, the sixth contact pin 406 and the eighth contact pin 408 are arranged in a second side wall of the housing 400 which is opposed to the first side wall.

A first carrier block 301, a second carrier block 302, a third carrier block 303 and a fourth carrier block 304 are arranged in the interior 410 of the housing 400. The carrier blocks 300 are oriented parallel to each other. The first carrier block 301 and the second carrier block 302 are like the carrier block 300 in FIG. 3. The third carrier block 303 and the fourth carrier block 304 arranged in a mirror-inverted fashion with respect to the second carrier block 302 and the first carrier block 301. The first carrier block 301, the second carrier block 302, the third carrier block 303 and the fourth carrier block 304 are collectively also designated as carrier blocks 300 hereinafter.

The carrier blocks 300 are arranged on the base surface of the interior 410 of the housing 400 such that the base sides 340 of the carrier blocks 300 face the base surface 411 of the housing 400. Preferably, the base sides 340 of the carrier blocks 300 are soldered on the base surface 411 of the interior 410 of the housing 400. The soldering can be carried out by a soft solder or a preform, for example, at a temperature of 180° C. The carrier blocks 300 are preferably in good thermal contact with the base surface 411 of the housing 400.

Since the base sides 340 of the carrier blocks 300 face the base surface 411 of the housing 400, the emission directions 331 of all the laser chips 100 arranged on the carrier blocks 300 are oriented perpendicular to the base surface 411.

It is also possible for the emission directions 331 of all the laser chips 100 arranged on the carrier blocks 300 to be oriented differently from perpendicular to the base surface 411. In this regard, the emission directions 331 of the laser chips 100 can assume a fixed angle relative to the base surface 411. That can be achieved, for example, by a non-cuboidal shape of the carrier blocks 300, in the case of which the base side 340 is not oriented perpendicular to the longitudinal side 330.

Alternatively, it is also possible for the emission directions 331 of the individual laser chips 100 arranged on the carrier blocks 300 not to be oriented parallel to one another. In this regard, the emission directions 331 of the individual laser chips 100 can meet, for example, at a focal line or a focal point.

Each carrier block 300 electrically connects between two of the contact pins 401, 402, 403, 404, 405, 406, 407, 408 of the housing 400 by electrically conductive connections. By way of example, the first carrier block 301 electrically conductively connects to the first contact pin 401 by an eighth conductive connection 358 and electrically conductively connects to the second contact pin 402 of the housing 400 by a ninth conductive connection 359. The eighth conductive connection 358 extends from the first contact pin 401 to the second face 312 of the first contact block 310 of the first carrier block 301. The ninth conductive connection 359 correspondingly extends from the second face 322 of the second contact block 320 of the first carrier block 301 to the second contact pin 402. The eighth conductive connection 358 and the ninth conductive connection 359 can be, for example, wire bonding connections or ribbon bonding connections.

Production of the eighth conductive connection 358 and the ninth conductive connection 359 is facilitated by the second face 312 of the first contact block 310 and the second face 322 of the second contact block 320 being oriented parallel to the base surface 411 of the housing 400 and facing in the emission direction 131.

The series circuit 350 of the first carrier block 300 is arranged between the first contact pin 401 and the second contact pin 402 of the housing 400. Correspondingly, the series circuit 350 of the second carrier block 302 is arranged between the third contact pin 403 and the fourth contact pin 404 of the housing 400. The series circuit 250 of the third carrier block 303 is arranged between the fifth contact pin 405 and the sixth contact pin 406 of the housing 400. The series circuit 350 of the fourth carrier block 304 is arranged electrically between the seventh contact pin 407 and the eighth contact pin 408.

The series circuits 350 of the four carrier blocks 301, 302, 303, 304 can be driven separately from one another via the contact pins 401, 402, 403, 404, 405, 406, 407, 408. It is possible to provide more or fewer than four carrier blocks 300 in the housing 400. Moreover, each of the carrier blocks 300 can have more or fewer than six laser chips 100.

In the processing state shown in FIG. 4, the laser chips 100 can be subjected to a further functional test. By way of example, the functionality of the laser chips 100 on the carrier blocks 300 can be tested in continuous-wave operation.

Figure 6:
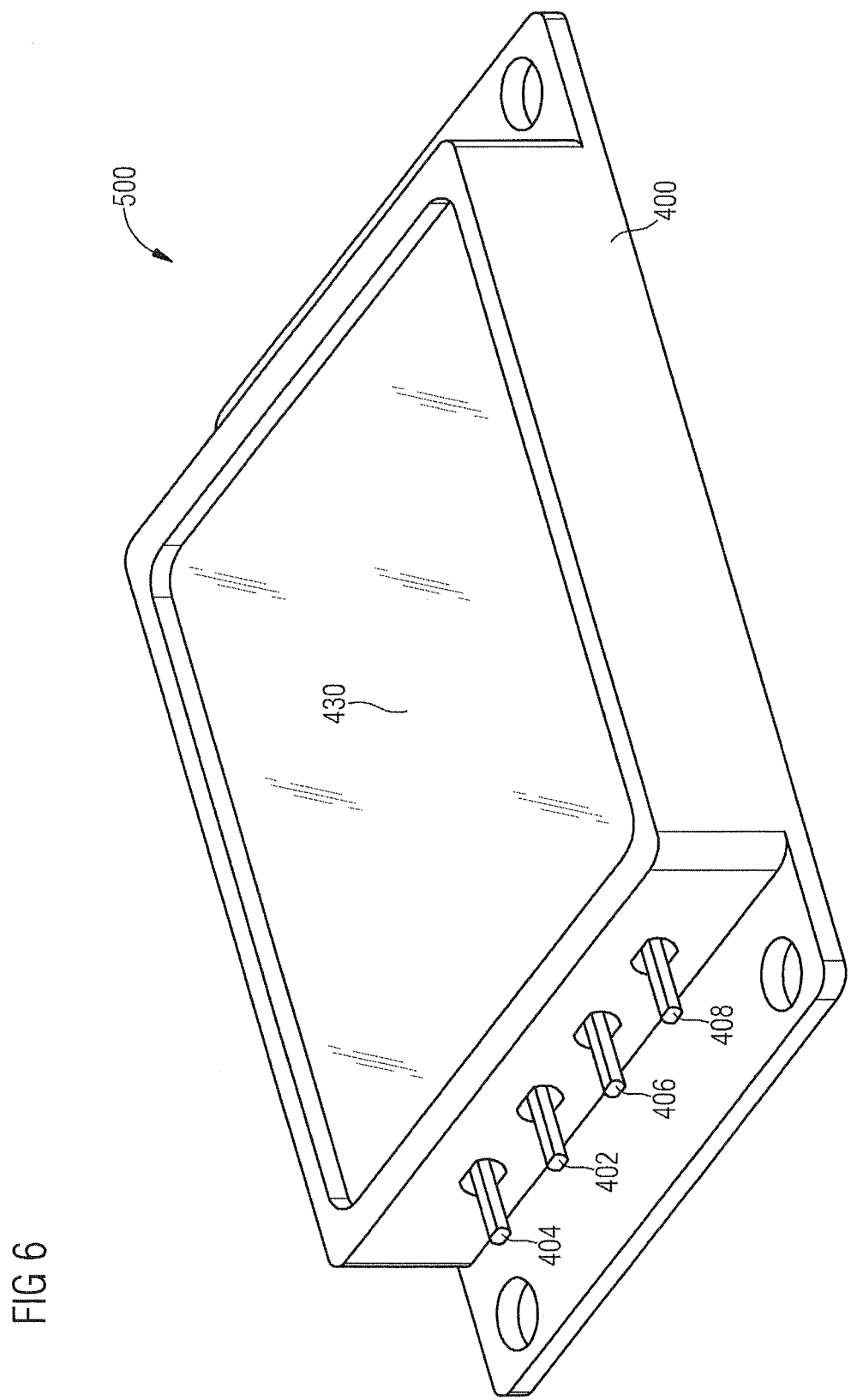
FIG. 6 shows the housing of the laser component closed with a glass window.

FIG. 6 shows a perspective illustration of the housing 400 in a processing state temporally succeeding the illustration in FIG. 4. In the illustration in FIG. 6, the housing 400 has been closed with a glass window 430. The housing 400 closed with the glass window 430 together with the carrier blocks 300 arranged therein forms a laser component 500.

The glass window 430 is oriented parallel to the base surface 411 of the housing 400. Laser radiation emitted by the laser chips 100 in the emission direction 131 can emerge from the housing 400 of the laser component 500 through the glass window 430. For this purpose, the glass window 430 is transparent to the laser radiation emitted by the laser chips 100.

The glass window 430 can optionally hermetically tightly seal the interior 410 of the housing 400. For this purpose, the glass window 430 can be inserted into the housing 400 by a welding process, for example. In a hermetically sealed closure of the housing 400, the interior 410 can be filled with a desired atmosphere, for example with dry air.

The laser component 500 comprises four carrier blocks 300, each carrier block 300 comprising six laser chips 100. The laser component 500 thus comprises 24 laser chips 100. It is possible, however, to provide the laser component 500 with fewer or more than 24 laser chips 100. Preferably, the laser component 500 comprises more than ten laser chips 100.

By way of example, the laser chips 100 of the laser component 500 can together comprise a total optical power of more than 25 W.

Figure 7:
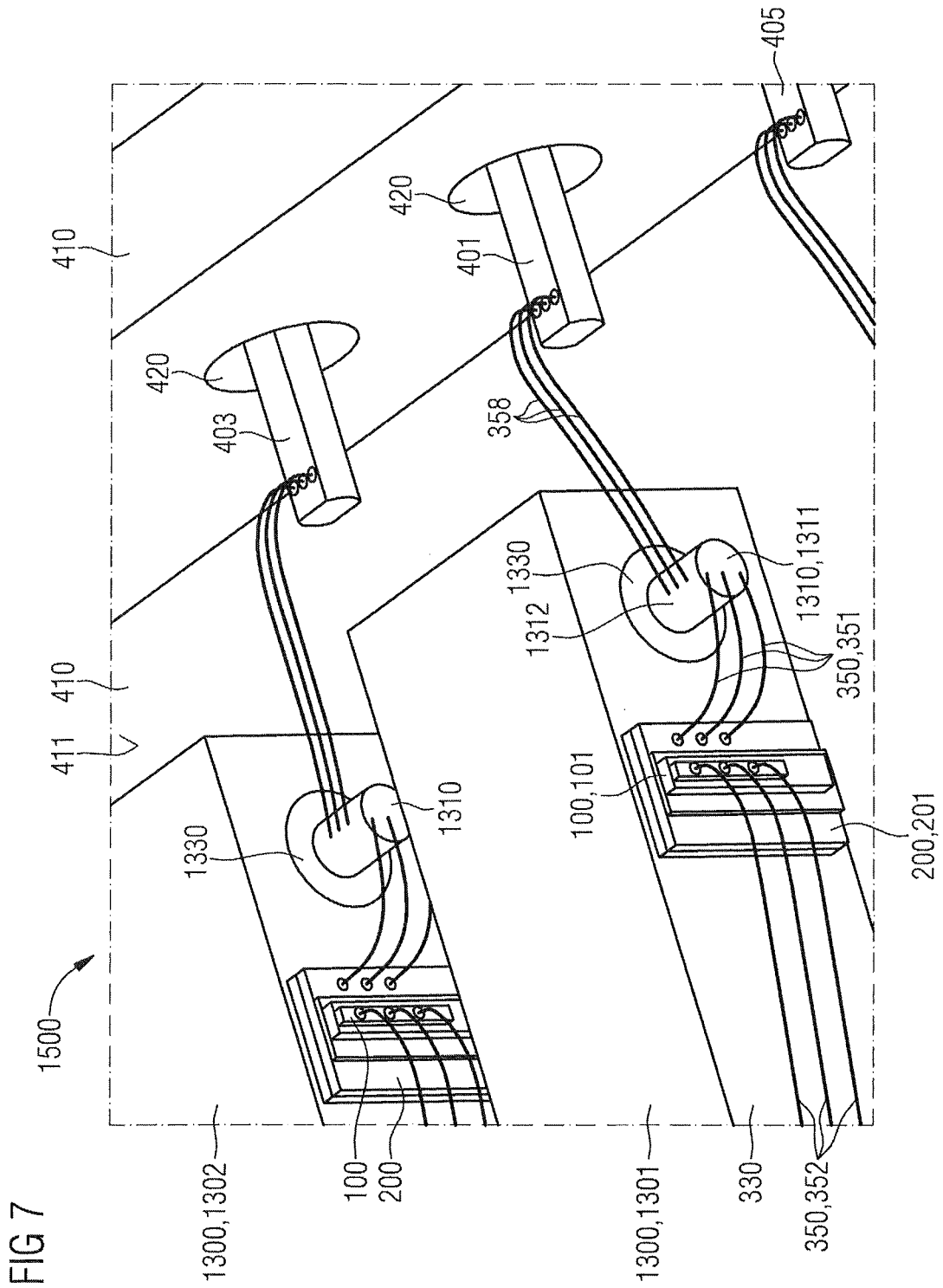
FIG. 7 shows a perspective view of part of a further laser component.

FIG. 7 shows a schematic perspective illustration of part of a laser component 1500. The laser component 1500 in FIG. 7 substantially corresponds to the laser component 500 explained with reference to FIGS. 1 to 6. Corresponding components in FIG. 7 are provided with the same reference signs as in FIGS. 1 to 6 and will not be described in detail again below. Essentially the differences between the laser component 1500 and the laser component 500 are explained hereinafter.

The laser component 1500 differs from the laser component 500 in that, instead of the carrier blocks 300, carrier blocks 1300 are arranged in the interior 410 of the housing 400. In the excerpt from the laser component 1500 as shown in FIG. 7, a first carrier block 1301 and a second carrier block 1302 can be discerned, which replace the first carrier block 301 and the second carrier block 302 of the laser component 500.

The carrier blocks 1300 differ from the carrier blocks 300 of the laser component 500 in that a first pin 1310 is present instead of the first contact block 310 and a second pin 1320 is present instead of the second contact block 320.

Figure 8:
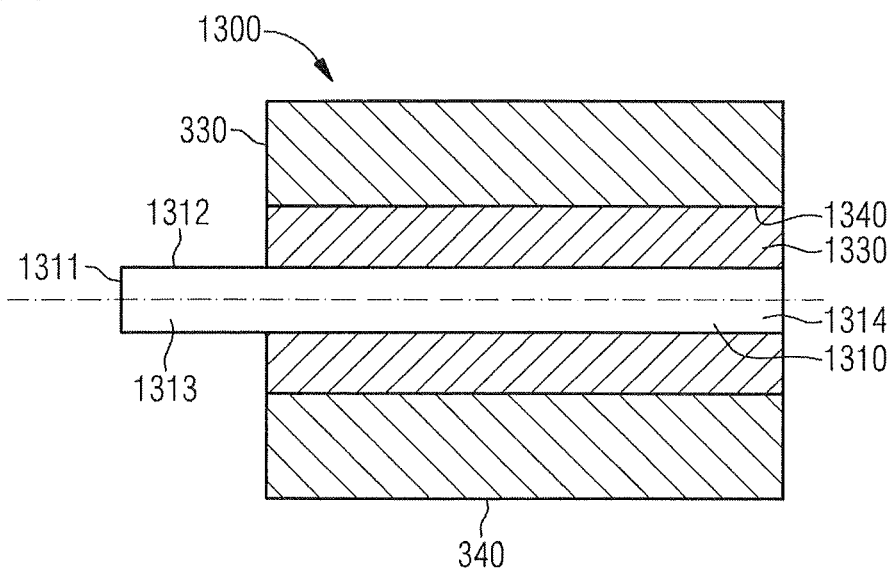
FIG. 8 shows a sectional view of a carrier block of the further laser component.
Figure 9:
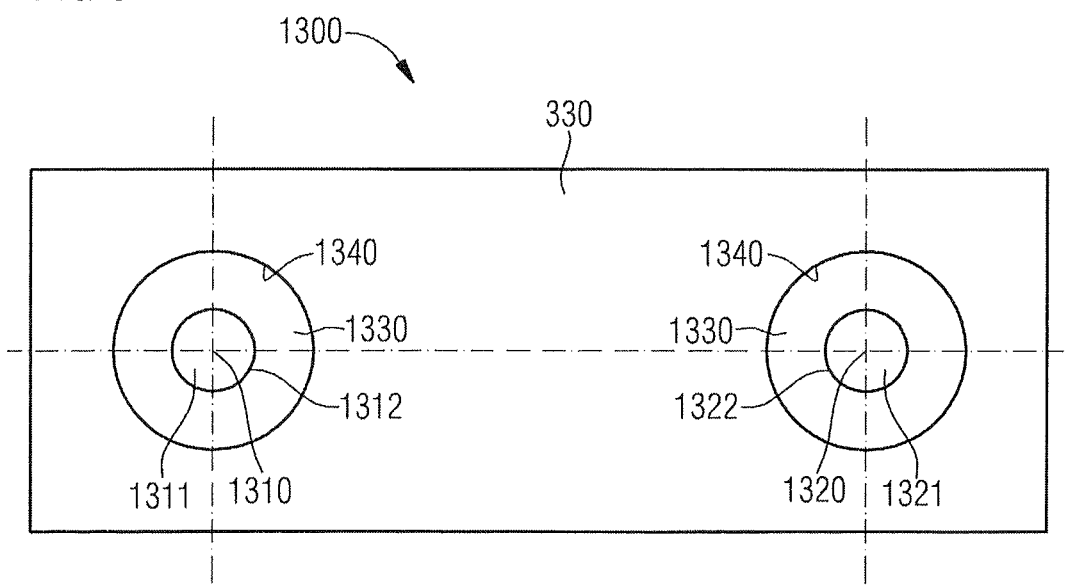
FIG. 9 shows a plan view of the carrier block.

FIG. 8 shows a sectional view of one of the carrier blocks 1300 in a schematic illustration. The carrier block 1300 is sectioned on a plane which is oriented perpendicular to the longitudinal side 330 of the carrier block 1300 and runs through the first pin 1310. FIG. 9 shows a schematic plan view of the longitudinal side 330 of a carrier block 1300.

The pins 1310, 1320 each comprise an electrically conductive material, for example, a metal. The pins 1310, 1320 are each circular-cylindrical pins. The first pin 1310 has an outer longitudinal end 1313 and an inner longitudinal end 1314. The second pin 1320 corresponds to the first pin 1310. The first pin 1310 is arranged in an opening 1340 of the carrier block 1300. The opening 1340 is a cylindrical through opening and extends in a direction perpendicular to the longitudinal side 330 of the carrier block 1300 from the longitudinal side 330 of the carrier block 1300 as far as a side of the carrier block 1300 that is opposite the longitudinal side 330. The inner longitudinal end 1314 of the first pin 1310 is arranged in the opening 1340 of the carrier block 1300. The outer longitudinal end 1313 of the first pin 1310 projects from the opening 1340 of the carrier block 1300 at the longitudinal side 330 of the carrier block 1300. The second pin 1320 is arranged in a corresponding manner in a further opening 1340 of the carrier block 1300.

The circular-cylindrical first pin 1310 has a lateral surface and two end faces. A first end face of the first pin 1310 is arranged at the outer longitudinal end 1313. A second end face of the first pin 1310 is arranged at the inner longitudinal end 1314. The second end face at the inner longitudinal end 1314 of the first pin 1310 terminates preferably approximately flush with the outer side of the carrier block 1300 opposite the longitudinal side 330 of the carrier block 1300.

The first end face of the first pin 1310, arranged at the outer longitudinal end 1313 of the first pin 1310, forms a first face 1311, the function of which corresponds to that of the first face 311 of the first contact block 310 of the carrier block 300 of the laser component 500. A part of the lateral surface of the circular-cylindrical first pin 1310 arranged near the outer longitudinal end 1313 of the first pin 1310 and facing away from the base side 340 of the carrier block 1300 forms a second face 1312, the function of which corresponds to that of the second face 312 of the first contact block 310 of the carrier block 300 of the laser component 500. The second pin 1320 has a first face 1321 arranged in a manner corresponding to the first face 1311 of the first pin 1310. Moreover, the second pin 1320 has a second face 1322 arranged in a manner corresponding to the second face 1312 of the first pin 1310.

The first faces 1311, 1321 of the pins 1310, 1320 of the carrier blocks 1300 of the laser component 1500, like the first faces 311, 321 of the contact blocks 310, 320 of the carrier blocks 300 of the laser component 500, are provided to establish electrically conductive connections 358, 359 to contact pins 401, 402, 403, 404, 405, 406, 407, 408 of the housing 400 of the laser component 1500. In this case, the electrically conductive connections 358, 359 can be, for example, wire bonding connections or as ribbon bonding connections. The second faces 1312, 1322 of the pins 1310, 1320 of the carrier blocks 1300 of the laser component 1500, like the second faces 312, 322 of the contact blocks 310, 320 of the carrier blocks 300 of the laser component 500, are provided to establish electrically conductive connections 351, 357 of the series circuits 350 between the laser chips 100. These conductive connections 351, 357, too, can be, for example, wire bonding connections or ribbon bonding connections.

The pins 1310, 1320 are electrically insulated from the carrier block 1300. The openings 1340 of the carrier block 1300 have a larger diameter than the pins 1310, 1320. An electrical insulator 1330 is arranged between those outer lateral surfaces of the pins 1310, 1340 which are arranged in the openings 1340 and the inner walls of the openings 1340. The insulator 1330 arranged in each opening 1340 thus has an approximately hollow-cylindrical form. The insulator 1330 can be formed by a glass, for example. In this case, the pins 1310, 1320 of the carrier block 1300 are glazed into the openings 1340. By way of example, glasses having a low melting point can be used for the insulators 1330.

The carrier blocks 1300 preferably comprise a material having a high thermal conductivity. By way of example, the carrier blocks 1300 can comprise copper. The pins 1310, 1320 can comprise iron-nickel alloys, for example. In this case, the pins 1310, 1320 advantageously have low coefficients of thermal expansion, as a result of which a destruction of the insulators 1330 caused by thermal changes in length can be prevented.

Preferably, the surfaces of the pins 1310, 1320 are coated such that they are solderable and wire-contact-connectable. By way of example, the surfaces of the pins 1310, 1320 can be coated with NiAu, NiPbAu or NiAg.

Further carrier blocks that can be provided instead of the carrier blocks 1300 in the laser component 1500 are described below with reference to FIGS. 10 to 14. The further carrier blocks exhibit correspondences to the carrier blocks 1300 in FIGS. 7 to 9. Corresponding components in FIGS. 10 to 14 are provided with the same reference signs as in FIGS. 7 to 9 and will not be described in detail again below. Only the differences between the further carrier blocks and the carrier blocks 1300 are explained hereinafter.

Figure 10:
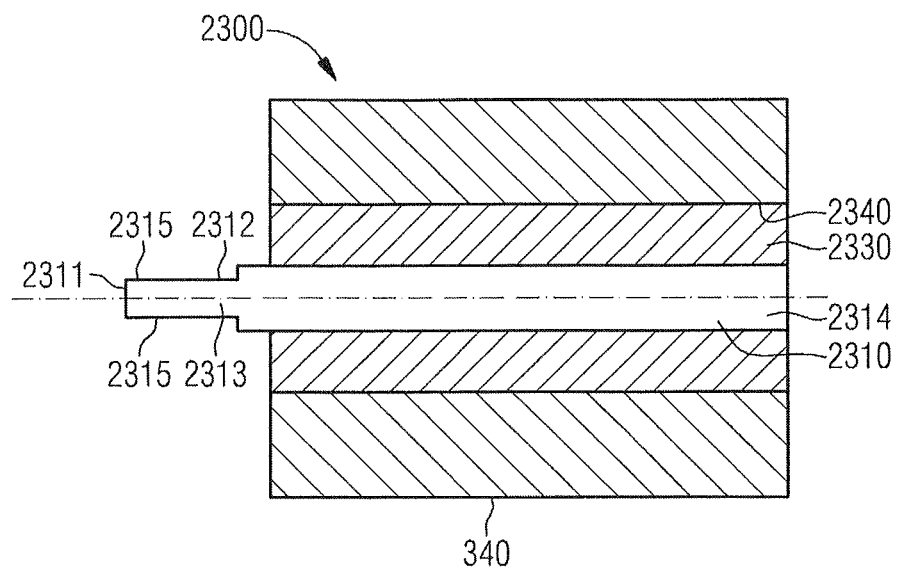
FIG. 10 shows a sectional view of a further carrier block.
Figure 11:
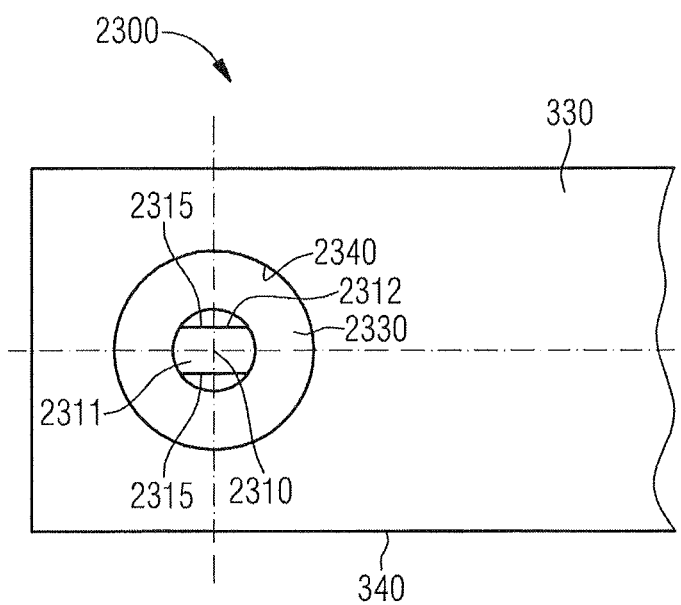
FIG. 11 shows a plan view of part of the further carrier block.

FIG. 10 shows a schematic sectional view of a carrier block 2300. FIG. 11 shows a schematic plan view of part of the longitudinal side 330 of the carrier block 2300. In the case of the carrier block 2300, a pin 2310 is provided instead of the first pin 1310. In the case of the carrier block 2300, a further pin, like the pin 2310, can be present instead of the second pin 1320.

The pin 2310 has an outer longitudinal end 2313 and an inner longitudinal end 2314. At the inner longitudinal end 2314, the pin 2310 is substantially circular-cylindrical. The inner longitudinal end 2314 of the pin 2310 is arranged in an opening 2340 of the carrier block 2300 and is insulated from the carrier block 2300 by an insulator 2330.

At the outer longitudinal end 2313, the pin 2310 has an additional flattened portion 2315 in relation to a circular-cylindrical form. Therefore, the pin 2310 has approximately the form of a beam at the outer longitudinal end 2313. A first face 2311 of the pin 2310 is formed by an end face at the outer longitudinal end 2313 of the pin 2310. A second face 2312 is formed in the region of the flattened portion 2315 at the outer longitudinal end 2313 of the pin 2310 and is oriented parallel to a top side of the carrier block 2300 opposite the base side 340 of the carrier block 2300.

The first face 2311 and the second face 2312 of the pin 2310 of the carrier block 2300 serve the same purpose as the first face 1311 and the second face 1312 of the first pin 1310 of the carrier block 1300. The second face 2312 of the pin 2310 of the carrier block 2300, the second face being formed in the region of the flattened portion 2315, affords the advantage over the second face 1312 of the first pin 1310 of the carrier block 1300, however, of being in a flat form and of thereby being contact-connectable to a wire bonding connection or a ribbon bonding connection more simply.

Figure 12:
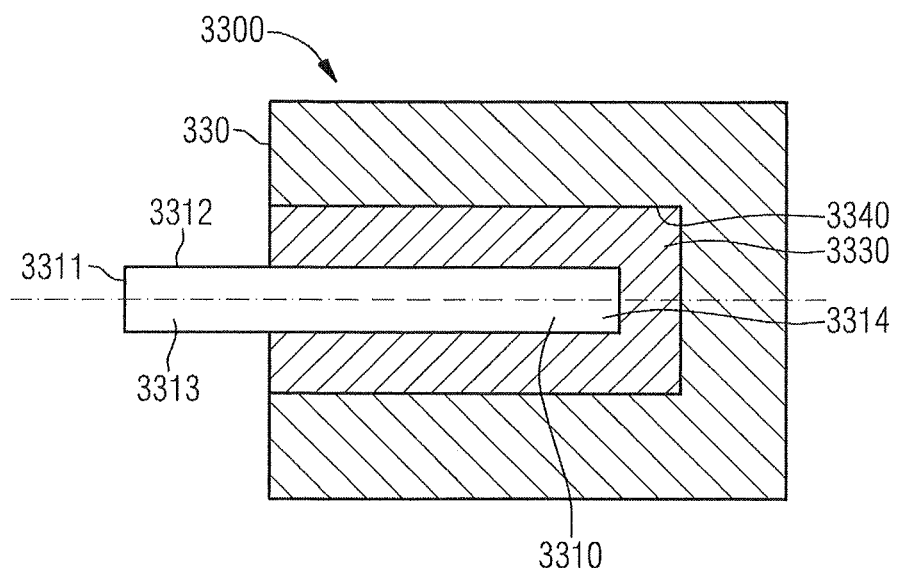
FIG. 12 shows a sectional view of a further carrier block.

FIG. 12 shows a schematic sectional view of a carrier block 3300. The carrier block 3300 has a pin 3310 having an outer longitudinal end 3313 and an inner longitudinal end 3314. The carrier block 3300 can in turn have a second pin like the pin 3310. The pin 3310 has a substantially circular-cylindrical form. However, the pin 3310 of the carrier block 3300 is shorter than the first pin 1310 of the carrier block 1300.

The inner longitudinal end 3314 of the pin 3310 is arranged in an opening 3340 of the carrier block 3300 and electrically insulated from the carrier block 3300 by an insulator 3330. In contrast to the openings 1340 of the carrier block 1300, the opening 3340 of the carrier block 3300 is a blind hole and extends from the longitudinal side 330 of the carrier block 3300 only into the carrier block 3300 and not as far as the outer side of the carrier block 3300 opposite the longitudinal side 330. In the opening 3340, the insulator 3330 encloses both the outer lateral surface of the pin 3310 and the end face of the pin 3310 that is arranged at the inner longitudinal end 3314. The example of the opening 3340 of the carrier block 3300 as a blind hole affords the advantage that an unintentional projection of the pin 3310 at the outer side of the carrier block 3300 opposite the longitudinal side 330 is reliably prevented.

At the outer longitudinal end 3313, the pin 3310 has a first face 3311 and a second face 3312. The first face 3311 and the second face 3312 correspond in terms of their position and function to the first face 1311 and the second face 1312 of the first pin 1310 of the carrier block 1300. However, it is also possible to have the first face 3311 and the second face 3312 of the pin 3310 like the first face 2311 and the second face 2312 of the pin 2310 of the carrier block 2300.

Figure 13:
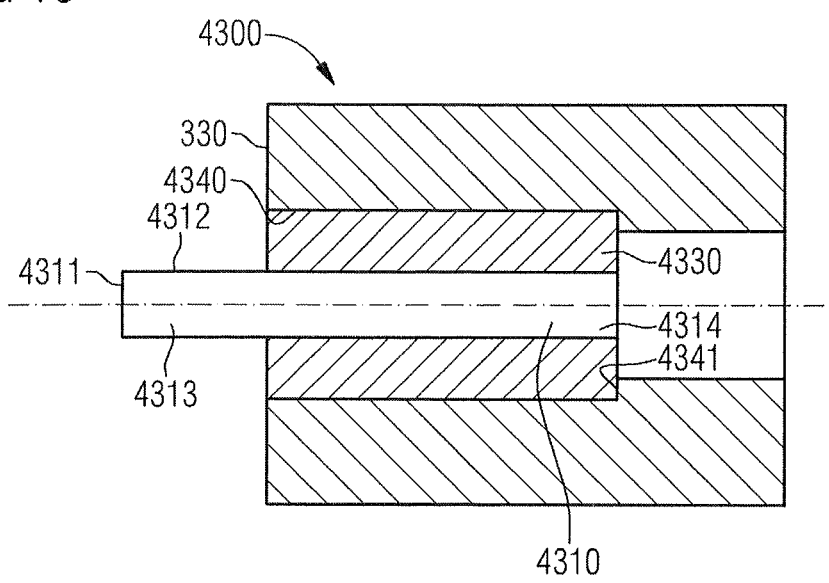
FIG. 13 shows a sectional view of a further carrier block.

FIG. 13 shows a schematic sectional view of a carrier block 4300. The carrier block 4300 has a pin 4310 having an outer longitudinal end 4313 and an inner longitudinal end 4314. The carrier block 4300 can have a second pin like the pin 4310.

The inner longitudinal end 4314 of the pin 4310 is arranged in an opening 4340 of the carrier block 4300. The opening 4340 is a stepped through opening and extends from the longitudinal side 330 of the carrier block 4300 as far as a side of the carrier block 4300 opposite the longitudinal side 330. In this case, the opening 4340 has a larger diameter in its part open toward the longitudinal side 330 than in its part open toward the side opposite the longitudinal side 330. A shoulder 4341 is formed between the two parts of the opening 4340, the diameter of the opening 4340 changing at the shoulder.

The pin 4310 extends only into that part of the opening 4340 adjacent to the longitudinal side 330 and has a large diameter and in this region is surrounded by an insulator 4330, which electrically insulates the pin 4310 from the carrier block 4300. The end face of the pin 4310 at the inner longitudinal end 4314 of the pin 4310 is arranged approximately in the region of the shoulder 4341 of the opening 4340.

The example of the opening 4340 of the carrier block 4300 as a stepped through opening affords the advantage that no gas bubbles can be included in the opening 4340 during a process of glazing the pin 4310 into the opening 4340 of the carrier block 4300. At the same time, the example of the opening 4340 as a stepped through opening prevents the inner longitudinal end 4314 of the pin 4310 from projecting from the opening 4340 at the side of the carrier block 4300 opposite the longitudinal side 330. The shoulder 4341 of the opening 4340 forms a stop for the insulator 4330 during the process of arranging the pin 4310 and the insulator 4330 in the opening 4340 of the carrier block 4300.

At the outer longitudinal end 4313 of the pin 4310, the pin 4310 has a first face 4311 and a second face 4312. The position and function of the faces 4311, 4312 of the pin 4310 of the carrier block 4300 correspond to those of the faces 1311, 1312 of the first pin 1310 of the carrier block 1300. However, it is also possible to have the first face 4311 and the second face 4312 of the pin 4310 like the first face 2311 and the second face 2312 of the pin 2310 of the carrier block 2300.

Figure 14:
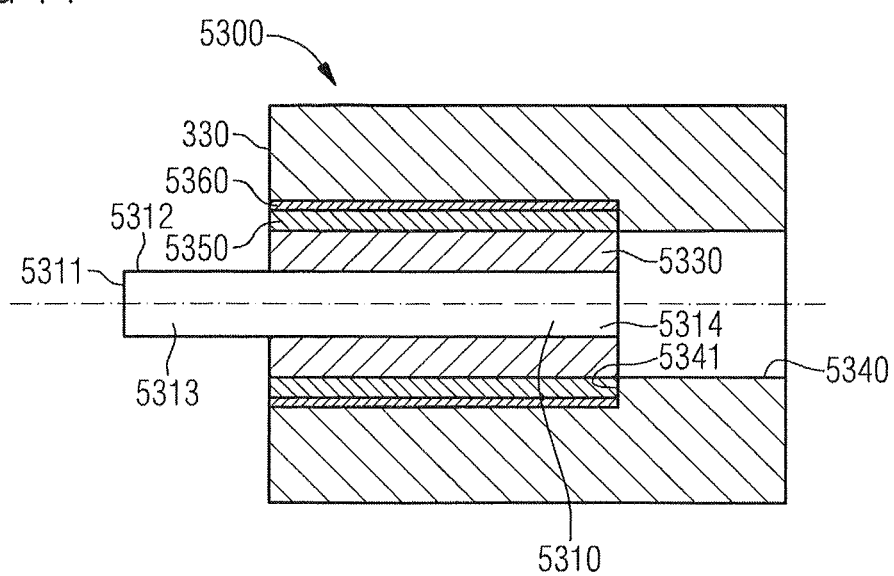
FIG. 14 shows a sectional view of a further carrier block.

FIG. 14 shows a schematic sectional side view of a carrier block 5300. The carrier block 5300 has a pin 5310 having an outer longitudinal end 5313 and an inner longitudinal end 5314. The carrier block 5300 can have a second pin like the pin 5310.

The inner longitudinal end 5314 of the pin 5310 is arranged in an opening 5340 of the carrier block 5300. The opening 5340 is a stepped through opening and extends from the longitudinal side 330 of the carrier block 5300 through the carrier block 5300 as far as a side of the carrier block 5300 opposite the longitudinal side 330. In this case, a part of the opening 5340 open toward the longitudinal side 330 has a larger diameter than a part of the opening 5340 open toward the side of the carrier block 5300 opposite the longitudinal side 330. A shoulder 5341 is formed between the two parts of the opening 5340, the diameter of the opening 5340 changing at the shoulder.

The inner longitudinal end 5314 of the pin 5310 is arranged in a sleeve 5350. The sleeve 5350 is a hollow-cylindrical shape and has an internal diameter greater than an external diameter of the pin 5310. The sleeve 5350 comprises an electrically conductive material, for example, an iron-nickel alloy. An insulator 5330 is arranged between the pin 5310 and the sleeve 5350 and electrically insulates the pin 5310 from the sleeve 5350. The insulator 5330 can comprise a glass, for example.

In the longitudinal direction, the length of the sleeve 5350 corresponds approximately to the depth of that part of the opening 5340 which has the larger diameter. The sleeve 5350 is arranged in that part of the opening 5340 which has the larger diameter, and is fixed by a solder 5360. There can thus be an electrically conductive connection between the sleeve 5350 and the carrier block 5300. However, the pin 5310 is insulated from the sleeve 5350 and the carrier block 5300 by the insulator 5330. The end side of the pin 5310 arranged at the inner longitudinal end 5314 is arranged approximately in the region of the shoulder 5341 of the opening 5340.

During production of the carrier block 5300, the inner longitudinal end 5314 can first be fixed in the sleeve 5350 by the insulator 5330. The sleeve 5350 can subsequently be fixed in the opening 5340 of the carrier block 5300 by the solder 5360. In this case, the shoulder 5341 of the opening 5340 can serve as a stop. This procedure advantageously reduces the mechanical loading of the insulator 5330 caused by thermal changes in length.

A first face 5311 and a second face 5312 are formed at the outer longitudinal end 5313 of the pin 5310. The position and function of the first face 5311 and of the second face 5312 of the pin 5310 of the carrier block 5300 corresponds to those of the first face 1311 and the second face 1312 of the first pin 1310 of the carrier block 1300. However, it is also possible to form the first face 5311 and the second face 5312 of the pin 5310 like the first face 2311 and the second face 2312 of the pin 2310 of the carrier block 2300.

Our components and methods have been described and illustrated more specifically on the basis of the preferred examples. Nevertheless, this disclosure is not restricted to the examples disclosed. Rather, other variations can be derived therefrom by those skilled in the art without departing from the scope of protection as defined in the appended claims.

The invention claimed is:

1. A laser component comprising a housing, the housing comprising a base surface and side walls perpendicular to the base surface,
   wherein a first contact pin and a third contact pin are arranged in a first side wall,
   a second contact pin and a fourth contact pin are arranged in a second side wall being opposed to the first side wall,
   a first carrier block and a second carrier block are arranged parallel to each other at the base surface,
   a first laser chip is arranged on a longitudinal side of the first carrier block and a further laser chip is arranged on a longitudinal side of the second carrier block,
   an emission direction of the first laser chip and of the further laser chip is oriented perpendicular to the base surface,
   the first carrier block and the second carrier block each comprise a first contact region and a second contact region arranged on longitudinal sides of the carrier blocks,
   each first contact region and each second contact region comprises a first face and a second face, the first face and the second face electrically conductively connected to one another and oriented perpendicular to each other,
   the first laser chip electrically conductively connects to the first faces of the first contact region and of the second contact region of the first carrier block,
   the further laser chip electrically conductively connects to the first faces of the first contact region and of the second contact region of the second carrier block,
   the second face of the first contact region of the first carrier block electrically conductively connects to the first contact pin,
   the second face of the second contact region of the first carrier block electrically conductively connects to the second contact pin,
   the second face of the first contact region of the second carrier block electrically conductively connects to the third contact pin, and
   the second face of the second contact region of the second carrier block electrically conductively connects to the fourth contact pin.

2. The laser component as claimed in claim 1, wherein first carrier block comprises a thermal conductivity of more than 300 W/mK.

3. The laser component as claimed in claim 1, wherein the base surface of the housing comprises copper.

4. The laser component as claimed in claim 1, wherein the side walls of the housing comprise another material than the base surface of the housing.

5. The laser component as claimed in claim 1,
   wherein a base side of the first carrier block is arranged perpendicular to the longitudinal side of the first carrier block, and
   the base side of the first carrier block faces the base surface of the housing.

6. The laser component as claimed in claim 1, wherein the emission direction of the first laser chip is oriented parallel to the longitudinal side and perpendicular to a longitudinal direction of the first carrier block.

7. The laser component as claimed in claim 1,
   wherein a first heat sink is arranged on the longitudinal side of the first carrier block, and
   the first laser chip is arranged on the first heat sink.

8. The laser component as claimed in claim 1,
   wherein a second laser chip is arranged on the longitudinal side of the first carrier block,
   an emission direction of the second laser chip is oriented parallel to the emission direction of the first laser chip, and
   the first laser chip and the second laser chip electrically connect in series between the first contact region and the second contact region of the first carrier block.

9. The laser component as claimed in claim 8, wherein the first laser chip and the second laser chip comprise a distance of 4 mm from one another.

10. The laser component as claimed in claim 1, wherein the laser chips of the laser component comprise a total optical power of more than 25 W.

11. The laser component as claimed in claim 7, wherein the first heat sink is a ceramic lamina.

12. The laser component as claimed in claim 1, wherein the housing is closed with a glass window oriented perpendicular to the emission direction of the first laser chip.

13. The laser component as claimed in claim 1, wherein the first carrier block is a copper cuboid.

14. The laser component as claimed in claim 1, wherein the first contact region is cuboid having an at least partly metallized surface.

15. The laser component as claimed in claim 1,
    wherein the first contact region is a pin,
    a longitudinal end of the pin is arranged in an opening of the first carrier block, and
    the pin is electrically insulated from the first carrier block.

16. The laser component as claimed in claim 15, wherein the opening of the first carrier block is a through opening or a blind hole.

17. The laser component as claimed in claim 15, wherein the opening of the first carrier block is a stepped through opening.

18. The laser component as claimed in claim 15, wherein the pin is electrically insulated from the first carrier block by a glass.

19. The laser component as claimed in claim 15,
    wherein the longitudinal end of the pin is arranged in a sleeve,
    the pin is electrically insulated from the sleeve, and
    the sleeve is soldered in the opening of the first carrier block.

20. The laser component as claimed in claim 1, wherein the laser component comprises more than ten laser chips.

21. The laser component as claimed in claim 20, wherein four carrier blocks each having six laser chips are arranged in the housing.

22. A method of producing a laser component comprising:
    arranging a first laser chip having an emission direction on a longitudinal side of a first carrier block;
    arranging a further laser chip having an emission direction on a longitudinal side of a second carrier block;
    establishing an electrically conductive connection between a first face of a first contact region arranged on the longitudinal side of the first carrier block, the first laser chip and a first face of a second contact region arranged on the longitudinal side of the first carrier block;
    establishing an electrically conductive connection between a first face of a first contact region arranged on the longitudinal side of the second carrier block, the further laser chip and a first face of a second contact region arranged on the longitudinal side of the second carrier block;

arranging the first carrier block and the second carrier block parallel to each other on a base surface of a housing such that the emission direction of the first laser chip and of the further laser chip is oriented perpendicular to the base surface;

establishing an electrically conductive connection between a second face of the first contact region of the first carrier block and a first contact pin arranged in a first side wall of the housing, the first side wall being arranged perpendicular to the base surface;

establishing an electrically conductive connection between a second face of the second contact region of the first carrier block and a second contact pin arranged in a second side wall of the housing, the second side wall being arranged perpendicular to the base surface and being opposed to the first side wall;

establishing an electrically conductive connection between a second face of the first contact region of the second carrier block and a third contact pin arranged in the first side wall of the housing; and establishing an electrically conductive connection between a second face of the second contact region of the second carrier block and a fourth contact pin arranged in the second side wall of the housing, the first face and the second face of each first contact region and each second contact region respectively electrically conductively connected to one another and oriented perpendicular to each other.

23. The method as claimed in claim 22, wherein arranging the first laser chip on the longitudinal side of the first carrier block comprises:

arranging the first laser chip on a first heat sink; and arranging the first heat sink on the longitudinal side of the first carrier block.

24. The method as claimed in claim 23, wherein arranging the first heat sink on the longitudinal side of the first carrier block is followed by a further step:

arranging a second heat sink with a second laser chip on the longitudinal side of the first carrier block, wherein the second heat sink is arranged such that an emission direction of the second laser chip is parallel to the emission direction of the first laser chip, wherein the first laser chip and the second laser chip electrically connect in series between the first contact region and the second contact region.

25. The method as claimed in claim 22, wherein the first laser chip is arranged on the longitudinal side of the first carrier block such that the emission direction of the first laser chip is oriented parallel to the longitudinal side and perpendicular to a longitudinal direction of the first carrier block.

26. The method as claimed in claim 22, further comprising:

closing the housing with a glass window oriented perpendicular to the emission direction of the first laser chip.

27. The method as claimed in claim 22, wherein arranging the first laser chip on the longitudinal side of the first carrier block and/or arranging the first carrier block on the base surface of the housing is carried out by soldering.

\* \* \* \* \*